(12) United States Patent
Nguyen et al.

(10) Patent No.: US 10,886,113 B2
(45) Date of Patent: Jan. 5, 2021

(54) PROCESS KIT AND METHOD FOR PROCESSING A SUBSTRATE

(71) Applicant: APPLIED MATERIALS, INC., Santa Clara, CA (US)

(72) Inventors: Thanh X. Nguyen, San Jose, CA (US); Weimin Zeng, San Jose, CA (US); Yong Cao, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 256 days.

(21) Appl. No.: 15/818,169

(22) Filed: Nov. 20, 2017

(65) Prior Publication Data

US 2018/0151337 A1 May 31, 2018

Related U.S. Application Data

(60) Provisional application No. 62/426,391, filed on Nov. 25, 2016.

(51) Int. Cl.
*C23C 14/36* (2006.01)
*H01J 37/34* (2006.01)
(Continued)

(52) U.S. Cl.
CPC .... *H01J 37/3441* (2013.01); *H01J 37/32651* (2013.01); *H01J 37/3438* (2013.01); *H01J 37/3488* (2013.01); *H01L 21/02266* (2013.01)

(58) Field of Classification Search
CPC .................. H01J 37/32651; H01J 37/3441
See application file for complete search history.

(56) References Cited

U.S. PATENT DOCUMENTS

| | | |
|---|---|---|
| 5,658,442 A | 8/1997 | Van Gogh et al. |
| 6,398,929 B1 | 6/2002 | Chiang et al. |

(Continued)

FOREIGN PATENT DOCUMENTS

JP     2001-247956 A     9/2001

OTHER PUBLICATIONS

International Search Report and Written Opinion dated Dec. 15, 2014 for PCT Application PCT/US2014/055624.

(Continued)

*Primary Examiner* — Jason Berman
(74) *Attorney, Agent, or Firm* — Moser Taboada

(57) ABSTRACT

Embodiments of process kits for process chambers and methods for processing a substrate are provided herein. In some embodiments, a process kit includes a non-conductive upper shield having an upper portion to surround a sputtering target and a lower portion extending downward from the upper portion; and a conductive lower shield disposed radially outward of the non-conductive upper shield and having a cylindrical body with an upper portion and a lower portion, a lower wall projecting radially inward from the lower portion, and a lip protruding upward from the lower wall. The cylindrical body is spaced apart from the non-conductive upper shield by a first gap. The lower wall is spaced apart from the lower portion of the non-conductive upper shield by a second gap to limit a direct line of sight between a volume within the non-conductive upper shield and the cylindrical body of the conductive lower shield.

20 Claims, 3 Drawing Sheets

(51) Int. Cl.
*H01J 37/32* (2006.01)
*H01L 21/02* (2006.01)

(56) References Cited

U.S. PATENT DOCUMENTS

| | | | |
|---|---|---|---|
| 7,569,125 B2 * | 8/2009 | Gung | C23C 14/046 204/298.11 |
| 2002/0102858 A1 | 8/2002 | Wicker et al. | |
| 2006/0137970 A1 | 6/2006 | Ahn | |
| 2006/0254904 A1 | 11/2006 | Golubovsky | |
| 2007/0178698 A1 | 8/2007 | Okita et al. | |
| 2008/0257263 A1 | 10/2008 | Pavloff et al. | |
| 2009/0272647 A1 | 11/2009 | Young et al. | |
| 2010/0252417 A1 | 10/2010 | Allen et al. | |
| 2011/0278165 A1 | 11/2011 | Rasheed et al. | |
| 2013/0153412 A1 | 6/2013 | Ritchie et al. | |
| 2014/0262763 A1 * | 9/2014 | Rasheed | H01L 21/68735 204/298.07 |
| 2015/0075980 A1 * | 3/2015 | Nguyen | H01J 37/3441 204/298.09 |
| 2018/0142340 A1 | 5/2018 | Johanson et al. | |

OTHER PUBLICATIONS

International Search Report and Written Opinion dated Feb. 8, 2018 received for Application PCT/US2017/062667.

* cited by examiner

PROCESS KIT AND METHOD FOR PROCESSING A SUBSTRATE

CROSS-REFERENCE TO RELATED APPLICATIONS

This application claims the benefit of U.S. Provisional Patent Application No. 62/426,391, filed with the United States Patent Office on Nov. 25, 2016, which is herein incorporated by reference in its entirety.

FIELD

Embodiments of the present disclosure generally relate to a semiconductor processing.

BACKGROUND

Some substrate process chambers utilize a process kit that includes a grounded shield surrounding the interior volume of the process chamber. The sputtering target is powered by RF and/or DC power and, thus, acts as a cathode. Because the shield is grounded, the shield acts as an anode. However, the inventors have discovered that after a certain number of processes have been carried out in a process chamber, the dielectric material sputtered from the sputtering target covers the grounded shield and an undesirable disappearing anode effect results. To overcome the aforementioned deficiency, a metal pasting step is performed so that the shield can act as an anode again. However, because the pasting step requires that processing be halted until the pasting step is performed, throughput is adversely affected.

Therefore, the inventors have provided an improved process kit for substrate process chambers.

SUMMARY

Embodiments of a process kit for process chambers and methods for processing a substrate are provided herein. In some embodiments, a process kit includes a non-conductive upper shield having an upper portion configured to surround a sputtering target and a lower portion extending downward from the upper portion; and a conductive lower shield disposed radially outward of the non-conductive upper shield and having a cylindrical body with an upper portion and a lower portion, a lower wall projecting radially inward from the lower portion, and a lip protruding upward from the lower wall, wherein the cylindrical body is radially spaced apart from the non-conductive upper shield by a first gap, and wherein the lower wall is vertically spaced apart from the lower portion of the non-conductive upper shield by a second gap configured to limit a direct line of sight between a volume within the non-conductive upper shield and the cylindrical body of the conductive lower shield.

In some embodiments, a process chamber includes a chamber body; a substrate support disposed within the chamber body; a sputtering target disposed within the chamber body above the substrate support; and a process kit disposed about the substrate support. The process kit includes an adapter coupled to a top of the chamber body; a non-conductive upper shield having an upper portion surrounding the sputtering target and a lower portion extending downward from the upper portion, wherein the upper portion is coupled to the chamber body via the adapter; and a conductive lower shield coupled to the chamber body radially outward of the non-conductive upper shield and having a cylindrical body with an upper portion and a lower portion, a lower wall projecting radially inward from the lower portion, and a lip protruding upward from the lower wall, wherein the cylindrical body is radially spaced apart from the non-conductive upper shield by a first gap, and wherein the lower wall is vertically spaced apart from the lower portion of the non-conductive upper shield by a second gap configured to limit a direct line of sight between a volume within the non-conductive upper shield and the cylindrical body of the conductive lower shield.

In some embodiments, a method of processing a substrate includes raising a substrate support supporting the substrate from a non-processing position to a processing position; forming a plasma within an interior volume of a process chamber to sputter material from a sputtering target onto the substrate. The process chamber includes a process kit having a non-conductive upper shield having an upper portion configured to surround a sputtering target and a lower portion extending downward from the upper portion; and a conductive lower shield disposed radially outward of the non-conductive upper shield and having a cylindrical body with an upper portion and a lower portion, a lower wall projecting radially inward from the lower portion, and a lip protruding upward from the lower wall, wherein the cylindrical body is radially spaced apart from the non-conductive upper shield by a first gap, and wherein the lower wall is vertically spaced apart from the lower portion of the non-conductive upper shield by a second gap configured to limit a direct line of sight between a volume within the non-conductive upper shield and the cylindrical body of the conductive lower shield; and a cover ring configured to interface with the lip, wherein the second gap is disposed entirely below the cover ring in the processing position.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of the scope of the disclosure, for the disclosure may admit to other equally effective embodiments.

Figure 1:
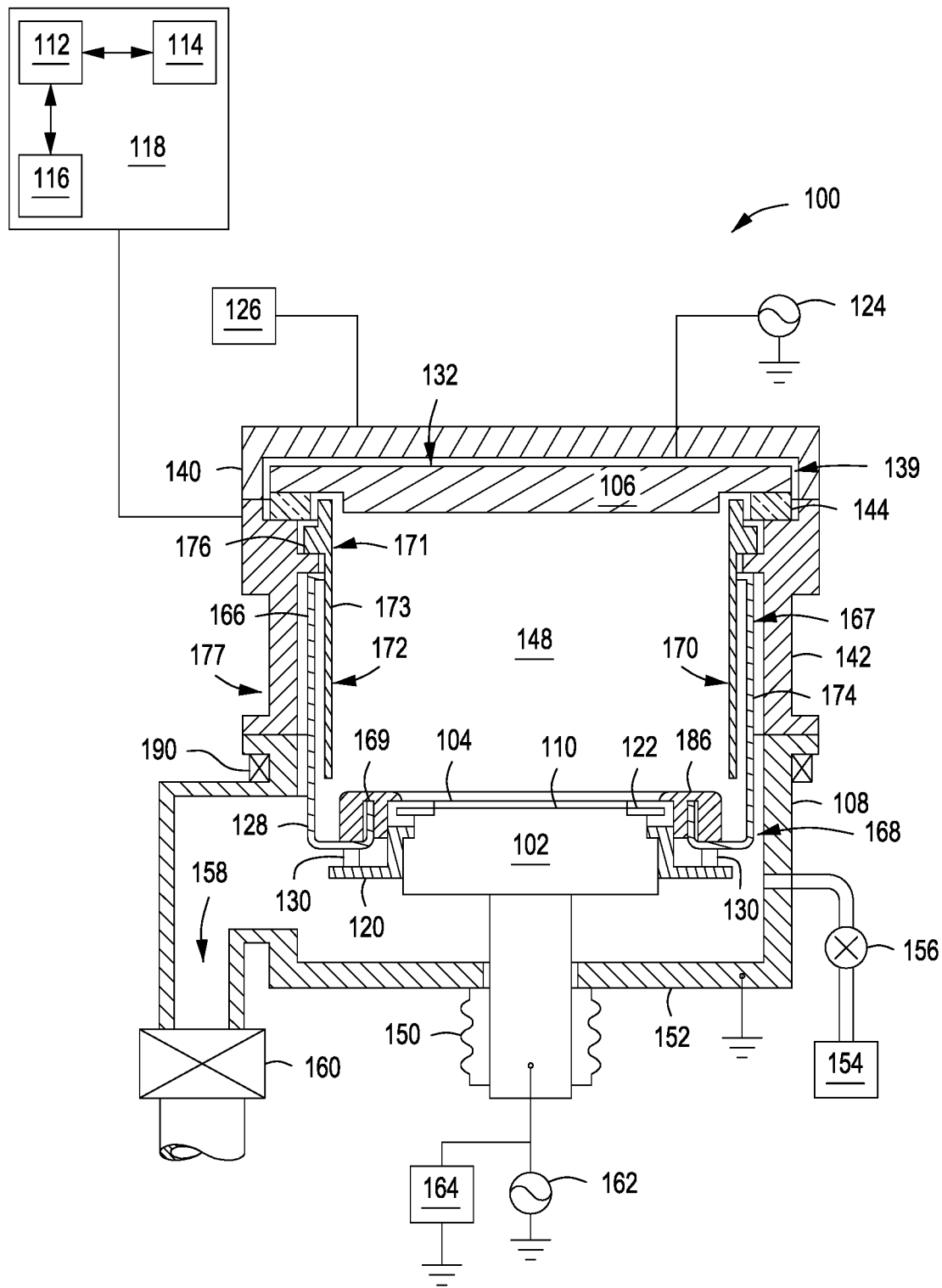
FIG. 1 depicts a process chamber suitable for use with a process kit in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a process kit for process chambers and methods for processing a substrate are provided herein. The inventive process kit includes a non-conductive upper shield and a conductive lower shield disposed radially outward of the non-conductive inner shield. The non-conductive upper shield overlaps a portion of the conductive lower shield. Because the non-conductive upper shield is disposed radially inward of the conductive lower shield, the non-conductive upper shield absorbs most of the dielectric material sputtered from the sputtering target. As a result, the conductive lower shield continues to function as an anode for a greater number of processes without a pasting step when compared to conventional process kit shields.

FIG. 1 depicts a schematic view of a process chamber suitable for use with the process kit described above in accordance with some embodiments of the present disclosure. Examples of suitable PVD chambers include the ALPS® Plus and SIP ENCORE® PVD process chambers, both commercially available from Applied Materials, Inc., of Santa Clara, Calif. Other process chambers from Applied Materials, Inc. or other manufactures may also benefit from the inventive method disclosed herein.

The process chamber 100 contains a substrate support 102 for supporting a substrate 104, and a sputtering source, such as a sputtering target 106. The substrate support 102 may be located within a chamber body 177, which includes a grounded lower body 108, a grounded adapter 142, a bottom chamber wall 152, and a ground shield 140. The sputtering target 106 may be coupled to a source distribution plate (not shown). The source distribution plate may be fabricated from suitable conductive materials to conduct power from one or more power sources to the sputtering target 106. Any number of power sources may be utilized to provide power to the sputtering target 106 to accommodate for a particular application or process performed in the process chamber 100. For example, in some embodiments, a DC power source 126 and RF power source 124 may provide DC power and RF power, respectively, to the sputtering target 106 via the source distribution plate. In such embodiments, the DC power source 126 may be utilized to apply a negative voltage, or bias, to the sputtering target 106. In some embodiments, RF energy supplied by the RF power source 124 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (e.g., two or more) to provide RF energy in a plurality of the above frequencies.

The ground shield 140 may be provided to cover the outside surfaces of the lid of the process chamber 100. The ground shield 140 may be coupled to ground, for example, via the ground connection of the chamber body. The ground shield 140 may comprise any suitable conductive material, such as aluminum, copper, or the like. In some embodiments, an insulative gap 139 may be provided between the ground shield 140 and the outer surfaces of the distribution plate, and the sputtering target 106 to prevent the RF and DC energy from being routed directly to ground. The insulative gap may be filled with air or some other suitable dielectric material, such as a ceramic, a plastic, or the like.

The sputtering target 106 may be supported on a grounded conductive adapter 142 through a dielectric adapter 144. In some embodiments, the grounded adapter 142 may be formed of aluminum. The sputtering target 106 comprises a material to be deposited on the substrate 104 during sputtering, such as, for example, a silicon or another dielectric material. In some embodiments, a backing plate 202 (shown in FIG. 2) may be coupled to the source distribution plate-facing surface 132 of the sputtering target 106. The backing plate 202 may comprise a conductive material, such as copper-zinc, copper-chrome, or the same material as the target, such that RF and DC power can be coupled to the target 406 via the backing plate 202. Alternatively, the backing plate 202 may be non-conductive and may include conductive elements (not shown) such as electrical feedthroughs or the like for coupling RF and DC power to the sputtering target 106.

The substrate support 102 has a support surface 110 facing the sputtering target 106 and supports the substrate 104 to be processed. In some embodiments, a conductive housing 120 may be disposed about at least a portion of the substrate support 102. The substrate support 102 may support the substrate 104 in an interior volume 148 of the process chamber 100 for processing. The interior volume 148 is defined as the region above the substrate support 102 during processing (for example, between the sputtering target 106 and the substrate support 102 when in a processing position).

In some embodiments, the substrate support 102 may be vertically movable through a bellows 150 connected to a bottom chamber wall 152 to allow the substrate 104 to be transferred onto the substrate support 102 through a load lock valve (not shown) in the lower portion of the process chamber 100 and thereafter raised to one or more positions for processing.

One or more processing gases may be supplied from a gas source 154 through a mass flow controller 156 into the lower part of the process chamber 100. An exhaust port 158 may be provided and coupled to a pump (not shown) via a valve 160 for exhausting the interior of the process chamber 100 and facilitating maintaining a desired pressure inside the process chamber 100.

In some embodiments, one or more power sources (an RF bias power source 162 and DC power source 164 shown) may be coupled to the substrate support 102. When present, the RF bias power source 162 may be coupled to the substrate support 102 to induce a negative DC bias on the substrate 104. In addition, in some embodiments, a negative DC self-bias may form on the substrate 104 during processing.

The process chamber 100 further includes a process kit 170 having a non-conductive upper shield 173 coupled to the dielectric adapter 144 and a conductive lower shield 174 coupled to the chamber body 177. In some embodiments, the non-conductive upper shield 173 may alternatively rest on a ledge 176 of the adapter 142. In some embodiments, the non-conductive upper shield 173 is cylindrical and includes an upper portion 171 surrounding the sputtering target 106 and a lower portion 172 extending downward from the upper portion 171. The conductive lower shield 174 includes a cylindrical body 166, having an upper portion 167 and a lower portion 168, a lower wall 128 projecting radially inward from the lower portion 168, and a lip 169 protruding upward from the lower wall 128. In some embodiments, the non-conductive upper shield 173 may be formed of a process-compatible ceramic such as, for example, quartz, sapphire, alumina, silicon carbide, and the like. In some embodiments, the conductive lower shield 174 may be formed of a conductive material such as, for example, aluminum and the like.

In some embodiments, one or more conductive bands 130 may electrically couple the conductive lower shield 174 to the conductive housing 120. In some embodiments, the process kit 170 also includes a cover ring 186 configured to interface with the lip 169 of the conductive lower shield 174 to ground the substrate support via the conductive lower shield 174 and the chamber body 177. A deposition ring 122 may be used to shield the periphery of the substrate 104 during processing.

Figure 2:
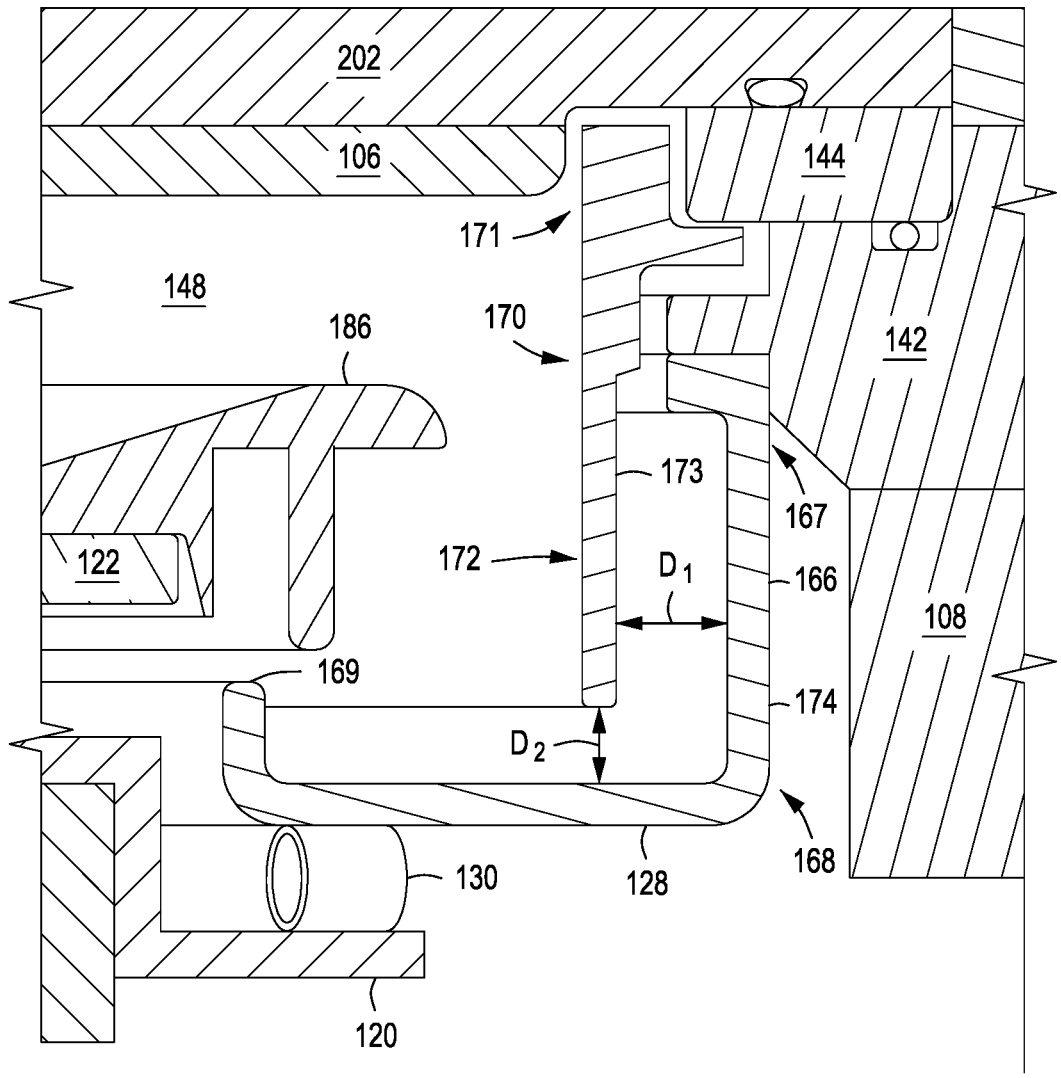
FIG. 2 depicts a cross-sectional view of a process kit for a substrate process chamber in accordance with some embodiments of the present disclosure.

FIG. 2 illustrates a close-up cross-sectional view of the process kit 170 in accordance with some embodiments of the present disclosure. As illustrated in FIG. 2, the non-conductive upper shield 173 extends over and shields the upper portion 167 and at least part of the lower portion 168 of the conductive lower shield 174. The cylindrical body 166 of the conductive lower shield 174 is radially spaced apart from the non-conductive upper shield 173 by a first gap $D_1$ between about 0.375 inches and about 1 inch. The lower wall 128 of the conductive lower shield 174 is vertically spaced apart from the lower portion 172 of the non-conductive upper shield 173 by a second gap $D_2$ between about 0.375 inches and about 1 inches and configured to limit a direct line of sight between a volume within the non-conductive upper shield 173 (i.e., the interior volume 148) and the cylindrical body 166 of the conductive lower shield 174. In some embodiments, the first and second gaps $D_1$, $D_2$ are equal. The first and second gaps $D_1$, $D_2$ allow a secondary plasma to form between the non-conductive upper shield 173 and the conductive lower shield 174, thus advantageously creating a "bridge" between the cathode and anode while shielding the anode (i.e., the conductive lower shield 174) from deposition of dielectric material.

Returning to FIG. 1, in some embodiments, a magnet 190 may be disposed about the process chamber 100 for selectively providing a magnetic field between the substrate support 102 and the sputtering target 106. For example, as shown in FIG. 1, the magnet 190 may be disposed about the outside of the grounded lower body 108 in a region just above the substrate support 102. In some embodiments, the magnet 190 may be disposed additionally or alternatively in other locations, such as adjacent the adapter 142. The magnet 190 may be an electromagnet and may be coupled to a power source (not shown) for controlling the magnitude of the magnetic field generated by the electromagnet.

A controller 118 may be provided and coupled to various components of the process chamber 100 to control the operation thereof. The controller 118 includes a central processing unit (CPU) 112, a memory 114, and support circuits 116. The controller 118 may control the process chamber 100 directly, or via computers (or controllers) associated with particular process chamber and/or support system components. The controller 118 may be any form of general-purpose computer processor that can be used in an industrial setting for controlling various chambers and sub-processors. The memory, or computer readable medium, 114 of the controller 118 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 116 are coupled to the CPU 112 for supporting the processor in a conventional manner. These circuits include cache, power supplies, clock circuits, input/output circuitry and subsystems, and the like. Inventive methods as described herein may be stored in the memory 114 as software routine that may be executed or invoked to control the operation of the process chamber 100 in the manner described herein. The software routine may also be stored and/or executed by a second CPU (not shown) that is remotely located from the hardware being controlled by the CPU 112.

Figure 3:
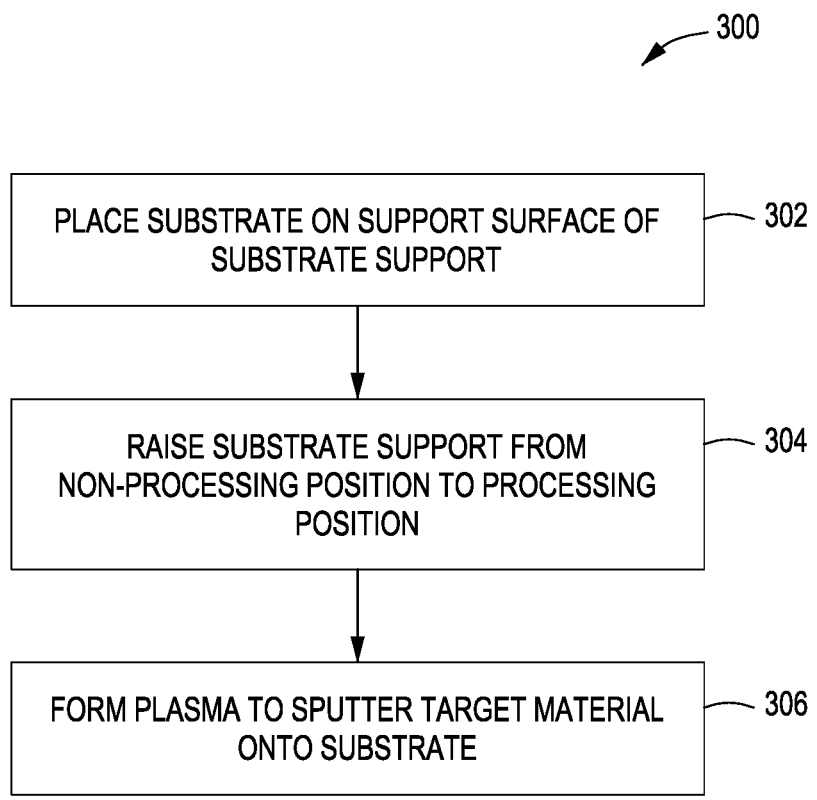
FIG. 3 is a flowchart illustrating a method of processing a substrate in accordance with some embodiments of the present disclosure.

FIG. 3 is a flowchart illustrating a method 300 of processing a substrate in accordance with some embodiments of the present disclosure. At 302, the substrate 104 is placed on the support surface 110 of the substrate support 102. At 304, the substrate support 102 is raised from a non-processing position (shown in FIG. 1) to a processing position (shown in FIG. 2). At 306, a plasma is formed within the interior volume 148 of the process chamber 100 to sputter material from a sputtering target 106 onto the substrate 104. As explained above, because the process kit 170 provides for the shielding of the anode (i.e., the conductive lower shield 174), more processes (e.g., method 300) can be run before a pasting step is needed to recover the anode, thus significantly improving the throughput of the process chamber 100.

Thus, embodiments of process kits for substrate process chambers are provided herein. The inventive process kit may facilitate increased throughput of the process chamber by allowing the conductive shield to continue to act as an anode for a longer period of time than conventional process kits.

While the foregoing is directed to embodiments of the present disclosure, other and further embodiments of the disclosure may be devised without departing from the basic scope thereof.

The invention claimed is:

1. A process kit, comprising:
   a non-conductive upper shield having an upper portion configured to surround a sputtering target and a lower portion extending downward from the upper portion; and
   a conductive lower shield disposed radially outward of the non-conductive upper shield and having a cylindrical body with an upper portion and a lower portion, a lower wall projecting radially inward horizontally from the lower portion to a lip protruding upward from the lower wall, wherein the cylindrical body is radially spaced apart from the non-conductive upper shield by a first gap, wherein the lip protrudes upward from the lower wall beyond the bottom surface of the lower portion of the non-conductive upper shield, and wherein an upper surface of the lower wall is disposed opposite and vertically spaced apart from a bottom surface of the lower portion of the non-conductive upper shield to define a second gap configured to limit a direct line of sight between a volume within the non-conductive upper shield and the cylindrical body of the conductive lower shield.

2. The process kit of claim 1, wherein an outer diameter of the lower shield is greater than an outer diameter of the upper shield.

3. The process kit of claim 1, wherein the first gap is between about 0.375 inches and about 1 inch.

4. The process kit of claim 1, wherein the second gap is between about 0.375 inches and about 1 inch.

5. The process kit of claim 1, wherein the first gap is equal to the second gap.

6. The process kit of claim 5, wherein the first gap and the second gap are each between about 0.375 inches and about 1 inch.

7. The process kit of claim 1, wherein the non-conductive upper shield is formed of a ceramic.

8. The process kit of claim 1, wherein the conductive lower shield is formed of aluminum.

9. The process kit of claim 1, further comprising:
   a cover ring configured to interface with the lip.

10. A process chamber, comprising:
    a chamber body;
    a substrate support disposed within the chamber body;

a sputtering target disposed within the chamber body above the substrate support; and a process kit disposed about the substrate support, the process kit comprising:

an adapter coupled to a top of the chamber body;

a non-conductive upper shield having an upper portion surrounding the sputtering target and a lower portion extending downward from the upper portion, wherein the upper portion is coupled to the chamber body via the adapter; and a conductive lower shield coupled to the chamber body radially outward of the non-conductive upper shield and having a cylindrical body with an upper portion and a lower portion, a lower wall projecting radially inward horizontally from the lower portion to a lip protruding upward from the lower wall, wherein the cylindrical body is radially spaced apart from the non-conductive upper shield by a first gap, wherein the lip protrudes upward from the lower wall beyond the bottom surface of the lower portion of the non-conductive upper shield, and wherein an upper surface of the lower wall is disposed opposite and vertically spaced apart from a bottom surface of the lower portion of the non-conductive upper shield to define a second gap configured to limit a direct line of sight between a volume within the non-conductive upper shield and the cylindrical body of the conductive lower shield.

11. The process chamber of claim 10, wherein the chamber body is grounded.

12. The process chamber of claim 11, further comprising:
a conductive band disposed between the substrate support and the lower wall to ground the substrate support via the conductive lower shield and the chamber body.

13. The process chamber of claim 10, wherein the adapter includes a ledge, and wherein the ledge is disposed vertically between the non-conductive upper shield and the conductive lower shield.

14. The process chamber of claim 10, wherein the first gap is between about 0.375 inches and about 1 inch.

15. The process chamber of claim 10, wherein the second gap is between about 0.375 inches and about 1 inch.

16. The process chamber of claim 10, wherein the first gap is equal to the second gap, and wherein the first gap and the second gap are each between about 0.375 inches and about 1 inch.

17. The process chamber of claim 10, wherein the non-conductive upper shield is formed of a ceramic.

18. The process chamber of claim 10, wherein the conductive lower shield is formed of aluminum.

19. The process chamber of claim 10, wherein the process kit further comprises:
a cover ring configured to interface with the lip.

20. A process kit, comprising:

a non-conductive upper shield having an upper portion configured to surround a sputtering target and a lower portion extending downward from the upper portion; and a conductive lower shield disposed radially outward of the non-conductive upper shield and having a cylindrical body with an upper portion and a lower portion, a lower wall projecting radially inward from the lower portion, and a lip protruding upward from the lower wall, wherein the cylindrical body is radially spaced apart from the non-conductive upper shield by a first gap between about 0.375 inches and about 1 inch, and wherein the lower wall is vertically spaced apart from the lower portion of the non-conductive upper shield by a second gap between about 0.375 inches and about 1 inch and configured to limit a direct line of sight between a volume within the non-conductive upper shield and the cylindrical body of the conductive lower shield.

\* \* \* \* \*